United States Patent [19]

Atakov et al.

[11] Patent Number: 5,382,831

[45] Date of Patent: Jan. 17, 1995

[54] INTEGRATED CIRCUIT METAL FILM INTERCONNECT HAVING ENHANCED RESISTANCE TO ELECTROMIGRATION

[75] Inventors: Eugenia M. Atakov, Acton; John J. Clement, Westboro; Brian C. Lee, Northboro, all of Mass.

[73] Assignee: Digital Equipment Corporation, Maynard, Mass.

[21] Appl. No.: 990,222

[22] Filed: Dec. 14, 1992

[51] Int. Cl.⁶ ............................ H01L 23/48; H01L 29/40
[52] U.S. Cl. ............................... 257/767; 257/734; 257/773
[58] Field of Search ............... 257/767, 734, 773, 775

[56] References Cited

U.S. PATENT DOCUMENTS

| | | | |
|---|---|---|---|
| 4,012,756 | 3/1977 | Chaudhan et al. | 257/734 |
| 4,166,279 | 8/1979 | Gangulee et al. | 257/767 |
| 4,295,147 | 10/1981 | Kircher et al. | 257/767 |
| 4,438,450 | 3/1984 | Sheng et al. | 257/767 |
| 5,018,001 | 5/1991 | Kondo et al. | 257/767 |
| 5,040,048 | 8/1991 | Yasue | 257/767 |

OTHER PUBLICATIONS

Schreiber, "Electromigration Mechanisms in Aluminum lines" 1985 Solid State Electronics vol. 28, No. 1 pp. 1153–1163.

Prokop & Joseph "Electromigration Failure at Aluminum-Silicon Contacts" 1972 J. Appl. Phys. vol. 43, No. 6 pp. 2595–2602.

Atakov et al., "Electromigration Failure Time Distribution: Scaling from a Test Structure to the VSLI Chip," Proc. of Ninth Int'l. VLSI Multilevel Interconnection Conf. (VMIC) (Jun. 1992), Santa Clara, Calif., U.S.A., pp. 366–371.

Lloyd et al., "The electromigration failure distribution: The fine-line case," J. Appl. Phys. vol. 69, No. 4, (Feb. 1991), pp. 2117–2127.

Cho et al., "Grain size dependence of electromigration-induced failures in narrow interconnects," Appl. Phys. Lett. Vo. 54, No. 25, (19 Jun. 1989) pp. 2577–2579.

D'Heurle & Peterson, "Electromigration", Encycl. of Semiconductor Technology, John Wiley & Sons (1984), New York, pp. 158–189.

Vaidya et al., "Electromigration Resistance of Fine--Line Al for VLSI Applications," IEEE Pub. No. CH1531-3/80/0000-0165, IEEE, New York, N.Y. (1980), pp. 165–170.

Vaidya et al., "Linewidth dependence of electromigration in evaporated Al–0.5% Cu," *Appl. Phys. Lett.* vol. 36, No. 6, (15 Mar. 1980), pp. 464–466.

Kinsbron, "A model for the width dependence of electromigration lifetimes in aluminum thin-film stripes," *Appl. Phys. Lett.* vol. 36, No. 12 (15 Jun. 1980) pp. 968–970.

Agarwala et al., "Dependence of Electromigration-Induced Failure Time on Lengtg and Width of Aluminum Thin-Film Conductors," *J. Appl. Phys.*, vol. 41, No. 10 (Sep. 1970), pp. 3954–3960.

*Primary Examiner*—Rolf Hille
*Assistant Examiner*—David Ostrowski
*Attorney, Agent, or Firm*—Robert J. Feltovic; Denis G. Maloney; Albert P. Cefalo

[57] ABSTRACT

For enhanced resistance to electromigration failure, a thin metal film interconnect on an integrated circuit chip should use multiple parallel minimum-width lines when the minimum linewidth is less than one and one-half times the mean grain size of the metal film. When the interconnect is longer than a certain predetermined length, then the multiple lines of the interconnect should have intermediate interconnections or bridges between neighboring ones of the multiple lines. When the interconnect is many times longer than the predetermined length, then the bridges define slots between the neighboring lines, and the slots should have a length of about the predetermined length. When the interconnect is many times longer than the predetermined length and the interconnect has more than two parallel lines, then the slots on one side of a parallel line should be staggered or offset with respect to the slots on the other side of the parallel line. The predetermined length should be about ten to twenty times the mean length of polycrystalline segments in a line of the minimum linewidth. For a 1.25 μm minimum linewidth and a 7,600 Å thick Al-1% Cu film having a 3.0 micron mean grain size, the predetermined length should be about 46 to 92 microns.

15 Claims, 7 Drawing Sheets

INTEGRATED CIRCUIT METAL FILM INTERCONNECT HAVING ENHANCED RESISTANCE TO ELECTROMIGRATION

BACKGROUND OF THE INVENTION

1. Field of the Invention

The present invention relates generally to a thin metal film interconnect for an integrated circuit, and more particularly to improving the resistance of a thin metal film to electromigration failure when the minimum linewidth of the integrated circuit fabrication process is less than one and one-half times the mean metal grain size of the metal film. Specifically, the invention relates to the use of parallel-connected narrow-width metal film lines to enhance the resistance of interconnections to electromigration failure.

2. Description of the Background Art

Thin metal film power buses in very-large-scale (VLSI) integrated circuits are known to have reliability problems due to mechanical and electrical instability when conducting high current densities. Mechanical stress, for example, results from the mismatch in thermal expansion coefficients between the metal film and the semiconductor substrate. It is known, for example, to improve the mechanical stability of thin metal film power buses by forming in the bus a number of equally-spaced and staggered slots parallel to the direction of current flow in the bus. The slotting permits the metal film to readily expand and contract without cracking and without disengagement from the substrate when the substrate expands and contracts in response to temperature changes.

Electromigration refers to a net motion of atoms due to the passage of electrical current through a metallic conductor. Aluminum-based thin-film metallizations, as widely used to form conductor patterns in silicon integrated circuits, are especially susceptible to failure from electromigration. The passage of a large current density creates a viscous drag on the metal ions, resulting in a diffusion of metal ions and vacancies in opposite direction. Near a point of flux divergence, the vacancies coalesce to form voids, which may cause an open-circuit failure. The metal atoms pile up downstream to form hillocks.

At the temperatures that are relevant to electromigration in thin metal film interconnects for integrated circuits, the dominant transport mechanism is grain-boundary diffusion. The grain-boundary diffusion varies from boundary to boundary according to the relative orientation of adjacent grains. Thin metal films do not usually have a very uniform grain size, and changes in grain size are often found where failures have occurred. Grain boundary triple points are a common cause of atomic flux divergence, and, therefore, voids due to electromigration tend to form at triple points. Failure will occur along the length of a conductor where void formation extends first across the whole width of the conductor.

It has been known for many years that the resistance of a thin-film metal line to electromigration failure is a function of the length and the width of the line. Failures occur randomly among similar samples, and, therefore, electromigration resistance is typically measured by a median failure time, "$t_{50}$", and a standard deviation, "$\sigma$", in the failure time. Long metal lines tend to have short $t_{50}$, but also small $\sigma$, since the probability of a configuration to early failures increases with the line length, and infinitely long lines would have identical distributions of structural configurations (hence equal failure times).

Studies of the width dependence of electromigration lifetimes in aluminum thin-film lines show that for a constant line length, the median failure time $t_{50}$ first decreases and then sharply increases as the line width W decreases. The width having the minimum $t_{50}$ is a function of the mean grain size D of the metal, with the minimum $t_{50}$ occurring at a width W of approximately twice the mean grain size D. The deviation $\sigma$, however, continually increases as the width W decreases. This behavior can be explained by serial and parallel failure unit models. For lines that are much wider than the mean grain size, there is an abundance of paths for migration parallel to the current flow. Assuming that potential failure sites such as triple-points are uniformly distributed and voids form at the triple-points, it is expected that the median failure time would decrease with decreasing width, because there would be a decreasing availability of paths for current flow around the voids. For lines that are much narrower than the mean grain size, however, the number of potential failure sites such as triple-points per unit length of the line decreases sharply with a decrease in line width. Therefore, there is a sharp increase in the mean failure time $t_{50}$ when the line width W decreases below the mean grain size.

When the width of a line is comparable to the mean grain size, the metal line behaves as a serial combination of "N" independent "failure units", so that the length of the line, "L", is related to N by:

$$L = (N)(L_0) \quad \text{(Equation 1)}$$

where $L_0$ is the length of an independent failure unit. In accordance with this serial failure unit model, as soon as any one of the units fails, the whole line fails. The line cumulative probability of failure, "G(t)", therefore, should be related to the unit probability of failure, "F(t)", by:

$$G(t) = 1 - (1 - F(t))^N \quad \text{(Equation 2)}$$

N is larger, and G(t) is higher, for longer lines. Moreover, there is a "saturation" of lifetime as L increases many times greater than $L_0$.

The unit probability of failure F(t) typically follows a lognormal function. In this case, the cumulative probability of failure, G(t), becomes the so-called "multi-lognormal" (MLN) cumulative distribution function:

$$G^*(t) = 1 - (\tfrac{1}{2}[1 - \text{erf}(\ln (t/t'_{50}))/\sqrt{2}\sigma')])^N \quad \text{(Equation 3)}$$

where $t'_{50}$ and $\sigma'$ are the median and standard deviation of the unit failure probability distribution function F(t). The median lifetime $t^*_{50}$ of the multi-lognormal probability distribution function $F^*(t)$ is given by:

$$t^*_{50} = t'_{50} \exp [\sqrt{2}\sigma' \text{erf}^{-1}(1 - 2(0.5)^{1/N})] \quad \text{(Equation 4)}$$

A shape factor $\sigma^*$ for the multi-lognormal cumulative distribution function $G^*(t)$ can be defined as the least squares lognormal fit through the 16% and 84% points of the multi-lognormal cumulative distribution function. As a function of the lognormal $\sigma'$ and N, $\sigma^*$ is given by:

$$\sigma^* = \sqrt{2}\sigma'[erf^{-1}(1-2(0.16)^{1/N}) - erf^{-1}(1-2(0.84)^{1/N})] \quad \text{(Equation 5)}$$

In addition to the length $L_0$ of an independent failure unit, there is discussion in the technical literature of other critical lengths related to potential failure sites. E. Kinsborn, "A model for the width dependence of electromigration lifetimes in aluminum thin-film strips." *Appl. Phys. Letters*, Vol. 36, No. 12, Jun. 15, 1980, pp. 968–970, for example, on pages 969–970, says that mass depletion at a cathode end of a metal line and mass accumulation at the anode end will build stress and concentration gradients between the anode and cathode ends. This gradient (inversely proportional to the line length) will create a reverse mass flow to the one produced by electromigration. For a given temperature and current density, there is a critical length $1_c$ below which backflow will balance the forward flux. For lines with widths small enough to form segments blocked by single-crystal grains, the time to failure and the failure location will be dependent on the difference between the length of the longest polycrystalline segment in the strip $1_{max}$ and the threshold length $1_c$. Generally, the stress gradient that produces the reversed atomic flow is built by the migrating atoms responding to the electromigration driving force. These migrating atoms will leave behind a vacancy concentration which will form voids after a certain period. During the time necessary to establish the final stress gradient, the depletion of atoms may be sufficient to cause voids to grow until the conductor line opens. In this event, the sample will fail even for polycrystalline segments shorter than $1_c$. The narrower the lines are, the higher probability of early failure, unless the failure structure permits a segmentation having very short lengths, or even a series of single crystals. In this event, the stress gradient will be built instantaneously and the void growth ceases before it reaches its critical size.

J. R. Lloyd and J. Kitchin, "The electromigration failure distribution: The fine-line case," *J. App. Phys.*, Vol. 69, No. 4, Feb. 14, 1991, pp. 2117–2127, on pages 2123 to 2124, discuss the selection of a failure element length for an electromigration failure model. Arguments have been proposed that suggest that the effect of stress gradients produced at locations of inverse flux divergence may be to change the rate of diffusion such that the flux divergence can vanish, eliminating the source as a potential failure site. This viewpoint is consistent with the experimental failure characteristics which suggest that the length of the failure element is larger than the grain size, and may be on the order of tens or hundreds of microns. For the failure model, another choice would be the length of conductor where we are certain that each element could act independently. This would be the so-called "Blech Length" which is the expected distance over which an electromigration-induced stress gradient would be significant, expressed as KT/F, where F is the electromigration driving force. This length is on the order of tens to hundreds of microns.

SUMMARY OF THE INVENTION

For typical process parameters for VLSI integrated circuit manufacture, the minimum line width ($W_{min}$) is less than one and one-half the mean grain size of the metal film used for circuit interconnections. Electromigration experiments show that the lifetime of an interconnection line having a width of one-half the mean grain size is about 100 times longer than the lifetime of a line having a width of from about one and one-half the mean grain size to twice the mean grain size. Typically power bus lines in VLSI integrated circuits have a width of from 3 to 10 times the minimum linewidth.

For enhanced resistance to electromigration failure, a thin metal film interconnect on an integrated circuit chip should use multiple parallel narrow-width lines in place of one wide line when the minimum linewidth is less than one and one-half times the mean grain size of the metal film. When the interconnect is longer than a certain predetermined length, then the multiple lines of the interconnect should have intermediate interconnections or bridges between neighboring ones of the multiple lines. When the interconnect is many times longer than the predetermined length, then the bridges define slots between the neighboring lines, and the slots should have a length of about the predetermined length. When the interconnect is many times longer than the predetermined length and the interconnect has more than two parallel lines, then the slots on one side of a parallel line should be staggered or offset with respect to the slots on the other side of the parallel line.

The predetermined length should be about ten to twenty times the mean length of polycrystalline segments in a single one of the neighboring lines. In a 1.25 $\mu$m line of 7,600 Å thick Al-1% Cu film having a 3.0 $\mu$m mean grain size, the mean length of the polycrystalline segments was about 4.5 microns, and the predetermined length should be about 46 to 92 microns.

The enhanced resistance to electromigration failure can permit the current density in the lines to be increased, so that chip area is used more efficiently. As a result, the circuits can be arranged more compactly on the chip, with shorter interconnections, and with improved speed characteristics, without compromising reliability.

BRIEF DESCRIPTION OF THE DRAWINGS

The novel features believed characteristic of the invention are set forth in the appended claims. The invention itself, however, as well as other features and advantages thereof, will be best understood by reference to the detailed description of a specific embodiment, when read in conjunction with the accompanying drawings wherein:

DETAILED DESCRIPTION OF THE PREFERRED EMBODIMENT

Figure 1:
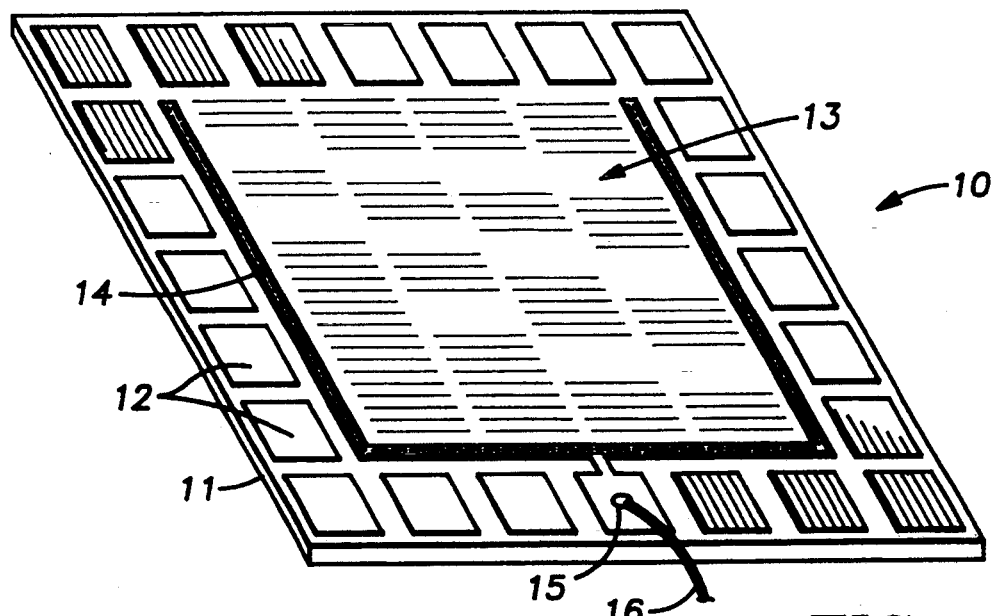
FIG. 1 is a pictorial view of an integrated circuit chip having a power bus according to the present invention.

Turning now to FIG. 1, there is shown an integrated circuit chip generally designated 10 including an upper layer of thin metal film on a semiconductor substrate 11. The thin metal film is etched by a photolithographic process to form bonding pads 12 around the periphery of the chip for the attachment of leads, such as the lead 16 bonded to the bonding pad 15. The thin metal film is also etched to define a multitude of very fine strips generally designated 13, which are discernable as individual strips only at high magnification, and convey signals between active elements formed in an upper layer of the semiconductor substrate 11. The thin metal film is also etched to form a power bus 14 in accordance with the present invention. The power bus 14 distributes power supply current from a bonding pad 15 to the active elements of the integrated circuit, and extends around a portion of the periphery of the integrated circuit to distribute a fair portion of the current to the active elements of output drivers (not shown) which assert output signals on many of the bonding pads 12.

Continual improvements in integrated circuit yield and shrinking feature size have resulted in the use of very thin metal film in integrated circuit chips that require relatively large amounts of power supply current. Unless a significant amount of integrated circuit area is devoted to the power bus 14, the current density in the power bus will exceed $1 \times 10^5$ A/cm$^2$ so that electromigration failure might substantially limit the lifetime of the integrated circuit.

Figure 2:
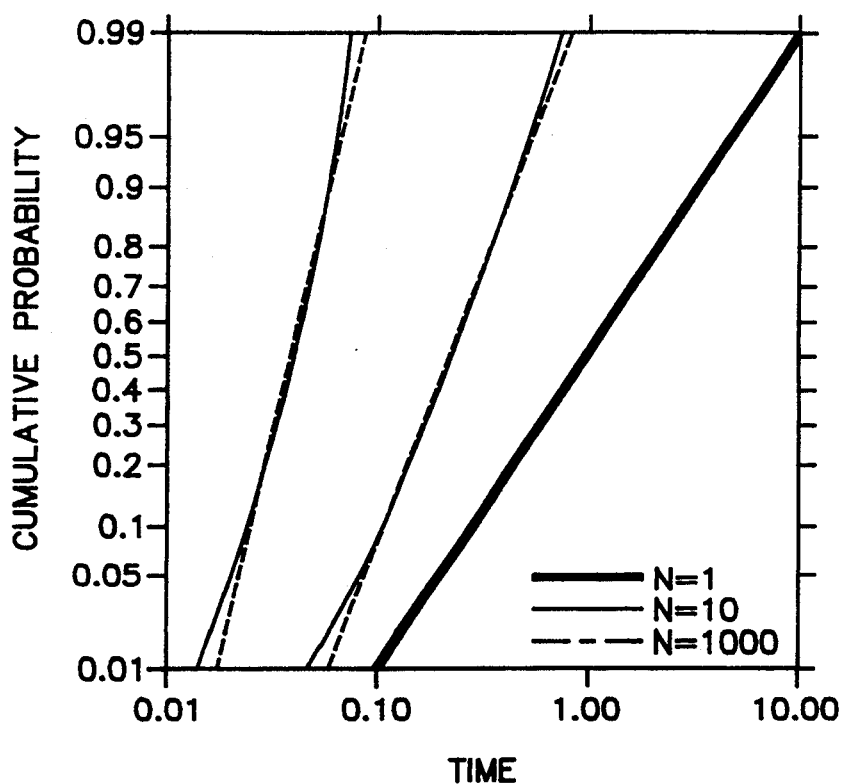
FIG. 2 is a graph of a multi-lognormal failure time distribution characteristic of circuit failure due to metal migration.

In order to estimate the electromigration lifetime of various integrated circuit configurations, an effort was made to validate the Multi-Lognormal model, as described above, by testing samples having various lengths and widths of thin metal film lines. The normalized lognormal (LN) and multi-lognormal (MLN) failure time distributions are plotted in FIG. 2. As the total number of elements, N, increases, both $t^*_{50}$ and $\sigma^*$ are reduced. The lognormal parameters for a particular linewidth can be uniquely determined from Equations 4 and 5 above, after the multi-lognormal characteristics have been measured for two different line lengths, and taking into account the statistical uncertainty of the experimental data.

Experimental

The test samples were taken from one lot, which was processed through two levels of metallization. Each metal layer was 7,600 Å thick Al-1% Cu film with a 400 Å thick TiN anti-reflective coating. The metal and anti-reflective coating was deposited in an MRC Eclipse sputtering system. The dielectric under the first layer of metal was 7,100 Å thick PSG PE-TEOS oxide, and the dielectric between the two metal layers was 7,500 Å thick planarized PE-TEOS oxide, and the wafers were passivated with a 7,500 Å thick layer of undoped oxide. Only lower-level metal lines were tested. The aluminum as-drawn linewidth was 1.5 μm. The linewidth loss during etching was found to be 0.25 μm. All test lines had Kelvin probes for resistance monitoring. Leads supplying current to the test lines were twice as wide as the test lines.

Figure 3:
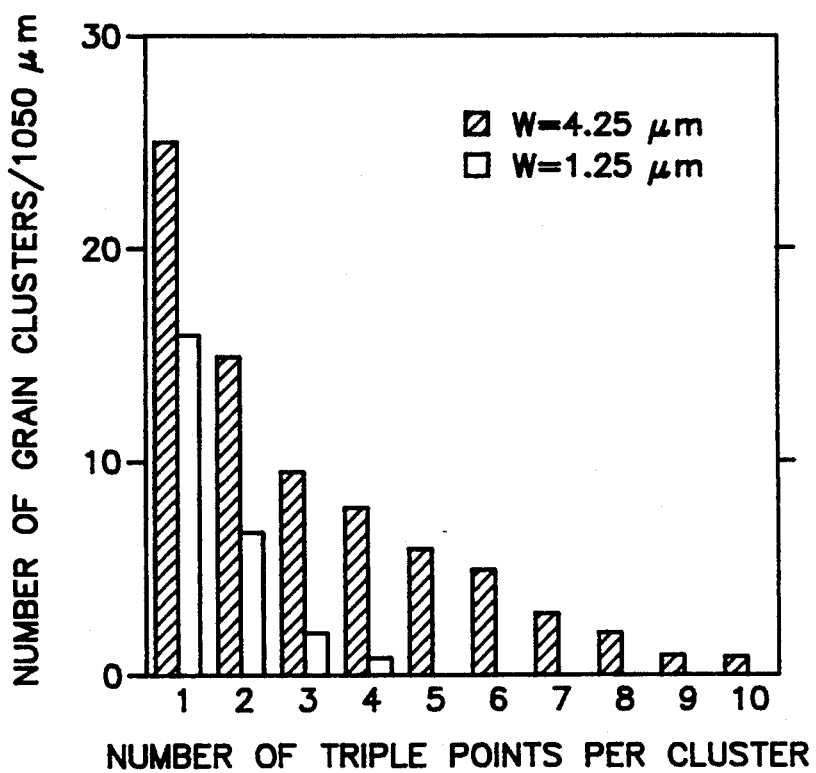
FIG. 3 is a graph of the distribution of triple-point clusters in thin metal film lines having a linewidth that is near the mean size of the metal grains in the metal film.

The mean grain size of the metal film was determined from an optical image to be 3.0 μm. In FIG. 3, a bar graph illustrates the distribution of polycrystalline segments, each having a cluster of triple points, over the number of triple points for 1.25 μm and 4.25 μm wide lines (actual dimensions). In wider lines, both the frequency of the segments and the number of triple points in them are larger as compared to the narrow lines. This can be interpreted as an increase in n=N/L and a decrease in $t_{50}$ of the independent failure units. On the average, a 1050×1.25 μm test line contains only three clusters of three or more triple points, and just one cluster of four triple points.

Lines that have a width W much smaller than the mean metal grain size D are often referred to in the literature as "bamboo" lines, because then the lines are comprised primarily of elongated segments of uniform metal crystal orientation analogous to the segments of uniform fiber in a bamboo pole. As introduced above, grain-boundary triple points are regarded as potential failure sites, and narrow "bamboo" lines have a much smaller number of triple points as compared to wider lines. However, we believe that an electromigration void can hardly be expected to form in an isolated triple point, and instead voids are expected to be formed in polycrystalline segments that contain at least a few triple points and that are at least as long as the so-called "Blech Length." As the line width becomes smaller than the average metal grain size, the polycrystalline segments become shorter, and therefore the probability of electromigration failure is reduced. For 1.25 μm lines, for example, voids appear to be formed only when the polycrystalline segments include clusters of four or more triple points and the polycrystalline segments are separated by "bamboo" grains. This is suggested by the fact that 1.25 μm wide lines have very few clusters of four or more triple points in comparison to 4.25 μm wide lines, as illustrated in FIG. 3, and 1.25 μm lines were found to have substantially enhanced electromigration resistance in comparison to 4.25 μm lines, as will be further described below with reference to FIGS. 4 and 5.

Figure 4:
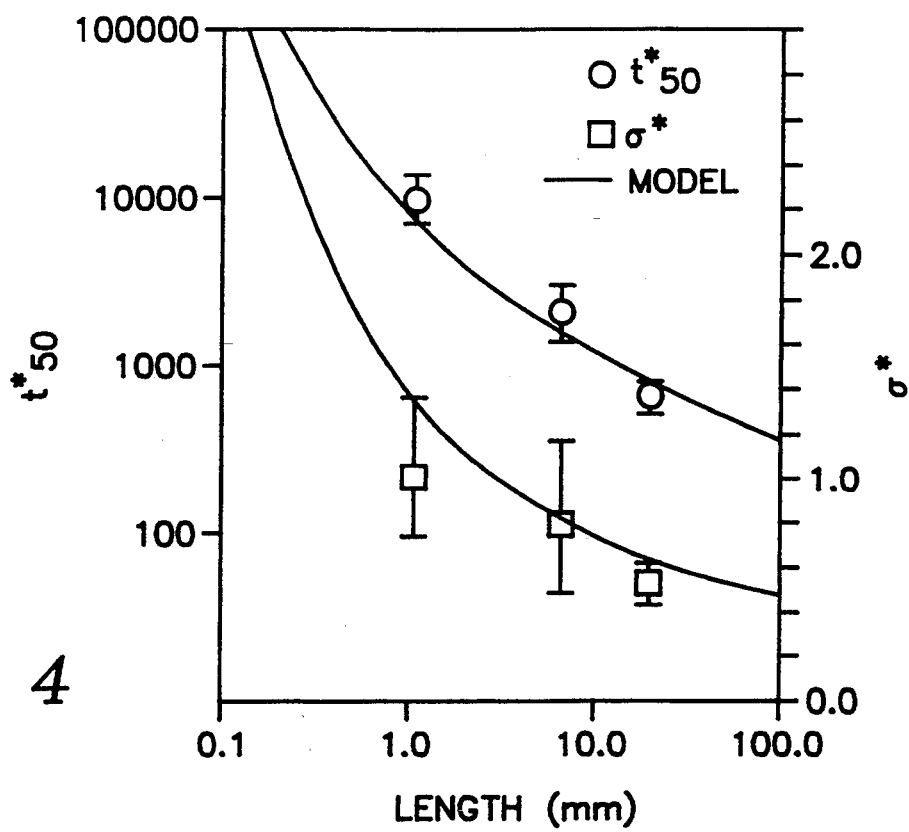
FIG. 4 is a graph of the mean electromigration failure time and the standard deviation in the failure time as a function of line length for thin metal film lines having a mean grain size of about 3.0 $\mu$m and a linewidth of 1.25 $\mu$m.
Figure 5:
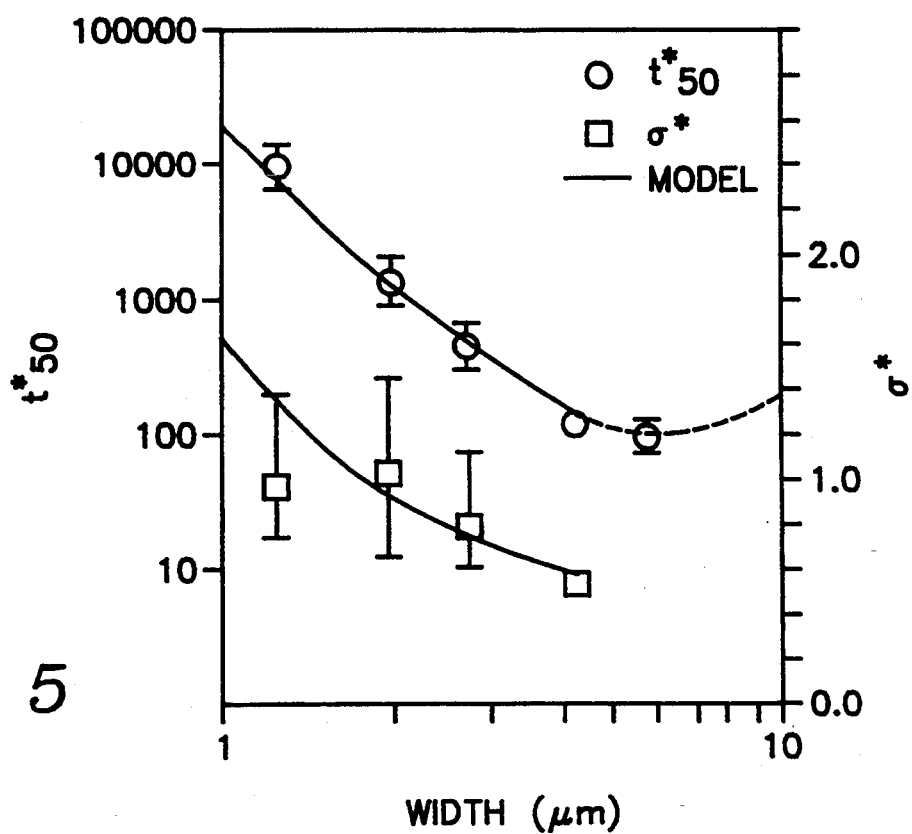
FIG. 5 is a graph of the mean electromigration failure time and the standard deviation in the failure time as a function of line width for thin metal film lines having a mean grain size of about 3.0 $\mu$m and a length of 1.05 mm.

The packaged parts were stressed at 220° C. oven temperature and $2.2 \times 10^6$ A/cm² current density. While all parts failed by forming an open, some of the opens occurred on the wide leads. The frequency of lead failures (FLF), i.e., the ratio of the number of lead failures to the total number of failures in a group, increased as the line length and width decreased, as shown in Table 1 below. Multiple censoring was applied to remove the lead failures from the lifetime distribution. All estimated $t^*_{50}$ values were adjusted for differences in Joule heating temperature, which varied from 5° C. to 15° C., depending on the test line geometry. $t^*_{50}$ decreased by a factor of about 20 as the line length was changed from 1,050 to 19,000 μm for 1.25 μm wide lines (FIG. 4). $t^*_{50}$ decreased by a factor of about 100 as the linewidth was increased from 1.25 μm to 4.25 μm (FIG. 5). In both cases, as $t^*_{50}$ fell, the shape factor, $\sigma^*$, was reduced. The error bars about the data points in FIGS. 4 and 5 represent 90% confidence intervals.

The Model Parameters

The model parameters are shown in Table 2 below. The ranges of model parameters for 1.25 μm wide lines were determined from the test data in FIG. 4. The solid lines in FIG. 4 were calculated from the model.

Figure 6:
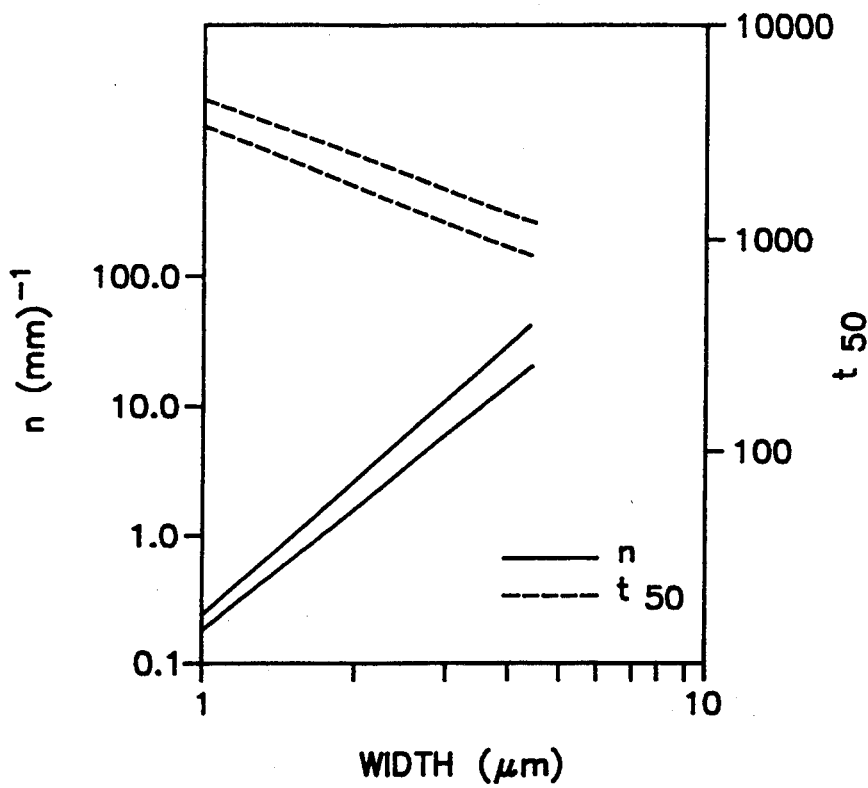
FIG. 6 is a graph of calculated intervals of independent failure unit (IFU) parameters as functions of linewidth for thin metal film lines having a mean grain size of about 3.0 μm.

Due to the lack of sufficient test data on different lengths for wider lines, all three model parameters could not be independently determined at widths other than 1.25 μm. Since n=N/L is expected to increase and $t^*_{50}$ to decrease as the linewidth increases, we chose to assume that $\sigma$ is independent of the line width. By setting $\sigma$ to the value computed for 1.25 μm lines, the other parameter value ranges were determined from the 4.25 μm wide line data in FIG. 5 and are included in Table 2. They are consistent with the microstructural observations. The parameters for intermediate linewidths were estimated by interpolation (FIG. 6). The solid lines in FIG. 5 are calculated from the model using the estimated independent failure unit (IFU) parameters. The dashed line in FIG. 4 shows the expected upturn of the lifetime width dependence at W>2D, where the independent failure unit model breaks down.

The VLSI Electromigration Failure Probability

Table 3 contains an estimate of the interconnect length/width distribution for a typical microprocessor chip with 3-level metallization. Only wires stressed close to the electromigration (EM) limit in 1.5–9.0 μm width range were taken into account. In the last two columns, we estimated the average $t^*_{50}$ and the total number of failure elements in each width category (the lognormal characteristics of 4.25 μm lines were used in the 4.5–9.0 μm range). Evidently, wider lines contribute much more to the chip electromigration failure probability than the minimum-width lines. Not only do the wider lines contain more failure elements, but $t^*_{50}$ of these elements is lower.

The cumulative probability of the chip electromigration failure was calculated from the following equation:

$$H(t) = 1 - \prod_i (1 - F_i(t))^{n_i L_i}$$

(Equation 6)

Figure 7:
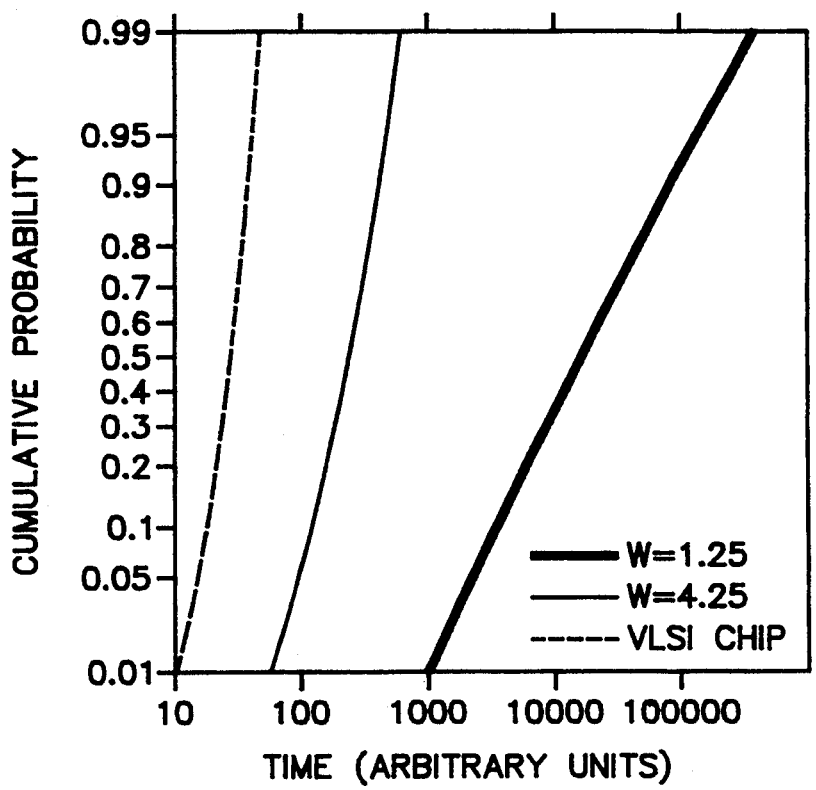
FIG. 7 is a graph of electromigration failure time distributions for a VLSI chip and two metal film lines having a mean grain size of about 3.0 μm, a length of 1.05 mm, and different widths of 1.25 μm and 4.25 μm.

The cumulative probability of the chip electromigration failure is plotted on a normalized lognormal scale in FIG. 7, together with probability plots for wide and narrow test lines.

Although not included in this example, the contribution of vias and contacts to the chip electromigration failure probability can be also accounted for by Equation 6, if nL is replaced by $N_j$, the number of vias of a particular kind, and the parameters of the lognormal $F_j(t)$ function are estimated from via lifetime measurements.

Test Structure Geometry Optimization

Lead failures clearly occur because electromigration proceeds faster in wider lines. Even though the current density in the leads was twice as low as in the test line, and the total lead length was less than 20% of the test line length, about ⅓ of all $1.5 \times 1050$ μm and $2.0 \times 1050$ μm test structure failures occurred on the leads (Table 1). As the line, and the leads, get wider, the frequency of lead failure decreases sharply. This is consistent with the observed bottoming out of the lifetime width dependence (FIG. 5). Predictably, the frequency of lead failure also decreases as the test line gets longer.

To avoid the lead failures, which effectively reduce the sample size, the leads should be made at least as wide as about three times the metal grain size D. A tapered transition region will help to reduce thermal gradients caused by Joule heating.

The test line of choice for routine electromigration tests and process development should be as wide as approximately one and one-half times the mean grain size D. Because both $t^*_{50}$ and $\sigma^*$ are smaller for such lines, time is saved, and a better accuracy is achieved in the evaluation of electromigration performance.

Interconnect Design Methods

The experimental results discussed above clearly indicate that the conventional interconnect design approach for handling high current density fails to exploit the sharp increase in resistance to electromigration failure when the linewidth W is reduced to less than about one and one-half times the mean grain size D. For the VLSI process parameters used in the experiment, for example, the minimum linewidth (actual) was 1.25 μm, in comparison to a mean grain size of 3.0 μm.

The conventional interconnect design approach for handling high current density increases the linewidth when necessary to limit the current density to a predetermined maximum density (J=$J_{max}$) selected for a sufficiently low failure rate ($G(T_0)$) during the expected lifetime ($T_0$) of the integrated circuit.

In accordance with an important aspect of the invention, the resistance of interconnects to electromigration failure is enhanced by using only narrow-width interconnect lines on the integrated circuit chip, but two or more interconnect lines are connected in parallel where necessary to prevent the current density from exceeding the predetermined maximum $J_{max}$. $J_{max}$, for example, should be about $1.7 \times 10^5$ A/cm² for AL-1% Cu metal film. The narrow-width interconnect lines should be narrower than 1.5 times the mean metal grain size. In many cases, the optimum width of the narrow lines should be the minimum width permitted by the design rules of the integrated circuit manufacturing processes, but, in some cases, the optimum width may be wider than the minimum width due to other considerations such as mechanical stress effects and the relatively large R-C time constant of narrow-width lines.

Figure 8:
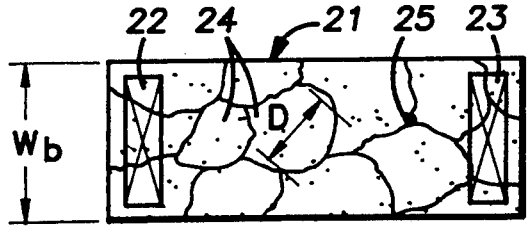
FIG. 8 is a plan view of a PRIOR ART thin metal film interconnect.

Turning now to FIG. 8, there is shown a conventional thin metal film interconnect 21 between a current source terminal 22 and a current sink terminal 23. The source terminal 22 and the sink terminal 23 are contact regions of the metal film 21 which connect the metal film to a lower layer (not shown) of the integrated circuit, in a fashion similar to the integrated circuit chip 10 shown in FIG. 1. Alternatively, one of the source or sink terminals 22, 23 could be a bonding pad, such as the bonding pad 15 for the power bus 14 in FIG. 1.

As shown in FIG. 8, the metal film of the interconnect 21 is organized into numerous crystal grains 24, which vary in size but are characterized by a certain mean grain size D. The metal film includes numerous metal grain triple-points, such as the triple-point 25. The interconnect 21 has a width $W_b$ that is about twice the mean metal grain size.

In accordance with an important aspect of the invention, the resistance to electromigration failure of the connection between the terminals 22 and 23 is substantially improved by interconnecting the terminals 22 and 23 with a plurality of narrow elongated metal film strips instead of one wide strip, when the narrow strips can have a width less than one and one-half times the mean metal grain size of the metal film. Preferably each of the strips has a width W that is the minimum width $W_{min}$ permitted under the established "design rules" for the integrated circuit manufacturing process, and neighboring ones of the lines are spaced by a certain minimum spacing $S_{min}$ permitted under the established design rules. To carry a current of I, the improved interconnect should use a number $N_{st}$ of strips that is at least one and is the closest integer to $$I/((J_{max})(W_{min})(x))$$

where x is the thickness of the metal film.

Figure 9:
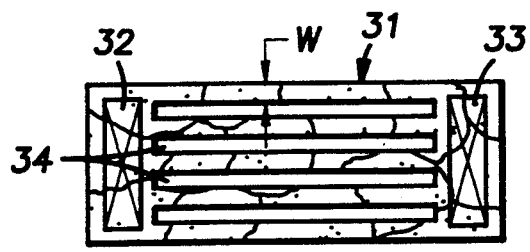
FIG. 9 is a plan view of a first embodiment of a thin metal film interconnect obtained by applying the method of the present invention to the PRIOR ART interconnect of FIG. 8.
Figure 10:
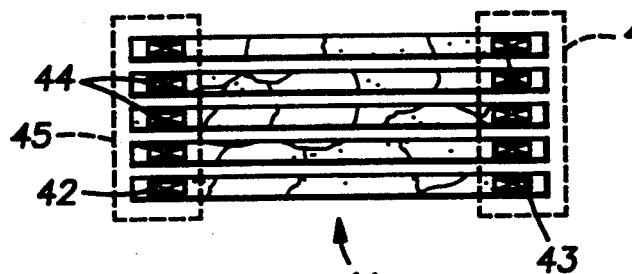
FIG. 10 is a plan view of a second embodiment of a thin metal film interconnect obtained by applying the method of the present invention to the PRIOR ART interconnect of FIG. 8.

Alternative interconnects using the present invention are shown in FIGS. 9 and 10. In FIG. 9, the contacts 32 and 33 are source and sink terminals for the interconnect 31, and connect the metal film of the interconnect 31 to another layer (not shown) of the integrated circuit (not shown). A number of elongated slots 34 are defined in the metal film of the interconnect 31. Therefore, the interconnect 31 of FIG. 9 can be derived from the layout or masks for the interconnect 21 of FIG. 8 by defining a number of slots $N_{SL}$ in the metal film so that the resulting elongated strips 34 separated by the slots all have the same width of approximately the minimum width $W_{min}$. The number of slots $N_{SL}$ is the closest integer to:

$$(W_b - W_{min})/(W_{min} + S_{min}).$$

In the alternative interconnect 41 of FIG. 10, each strip 44 has the minimum width, and the strips 44 are not interconnected by thin-film metal in the same layer as the thin-film metal of the strips. Instead, each strip has a separate source contact 42 and sink contact 43 to a source terminal 45 and a sink terminal 46 at a lower layer in the integrated circuit (not shown).

If the distance between the source and sink contacts (32, 33 in FIG. 9 or 42, 43 in FIG. 10) is greater than about one and one-half times a certain predetermined distance $l_{opt}$, then intermediate interconnections or bridges should be placed between neighboring pairs of the elongated strips. If the distance between the source and sink terminals is many times grater than the optimum distance $l_{opt}$, then the intermediate interconnections should define elongated slots between the neighboring strips, as illustrated in FIG. 11.

Figure 11:
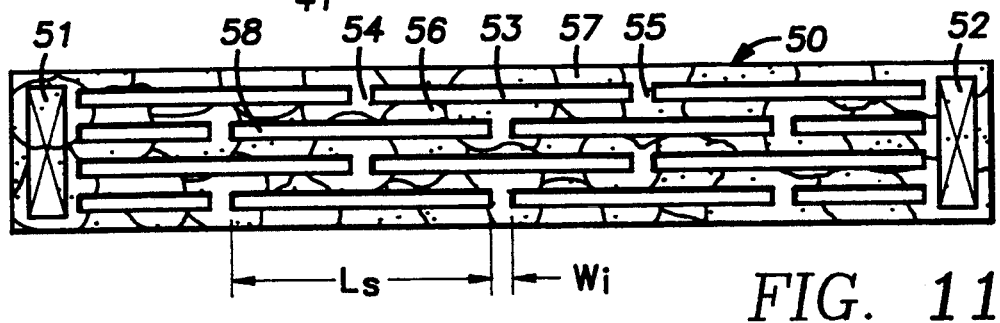
FIG. 11 is a plan view of a third embodiment of a thin metal film interconnect, in accordance with the present invention, that is preferred when the interconnect is longer than a certain predetermined length.

As shown in FIG. 11, a thin metal film interconnect 50 between a source terminal 51 and a sink terminal 52 is made of slotted thin metal film. A slot 53, for example, is defined by intermediate interconnections 54 and 55, and neighboring strips 56 and 57. Most of the slots in the metal film, with the exception of a few short slots near the source and sink terminals 51, 52, have the same length $L_S$, which is approximately the predetermined distance $l_{opt}$. Moreover, the intermediate connections 54, 55, are discontinuous in a direction perpendicular to the slots so that the slots are staggered. The intermediate interconnection 54, for example, does not extend across the whole width of the interconnect 50, but instead extends only so far as to the periphery of another slot 58 defined by the strip 56 and spaced in the perpendicular direction from the slot 53. Therefore, the slots on one side of the strip 56 are staggered or offset from the slots on the other side of the strip 56. Preferably, the width $W_i$ of the bridges should be a minimum width, such as the minimum width permitted by the design rules of the integrated circuit manufacturing process. With this staggered slot configuration, an open in one of the strips that might be caused by an electromigration failure causes a minimum increase in current density in the other strips. Therefore, the presence of the intermediate interconnections or bridges 54, 55 makes the interconnect 50 less prone to electromigration failure.

Figure 12:
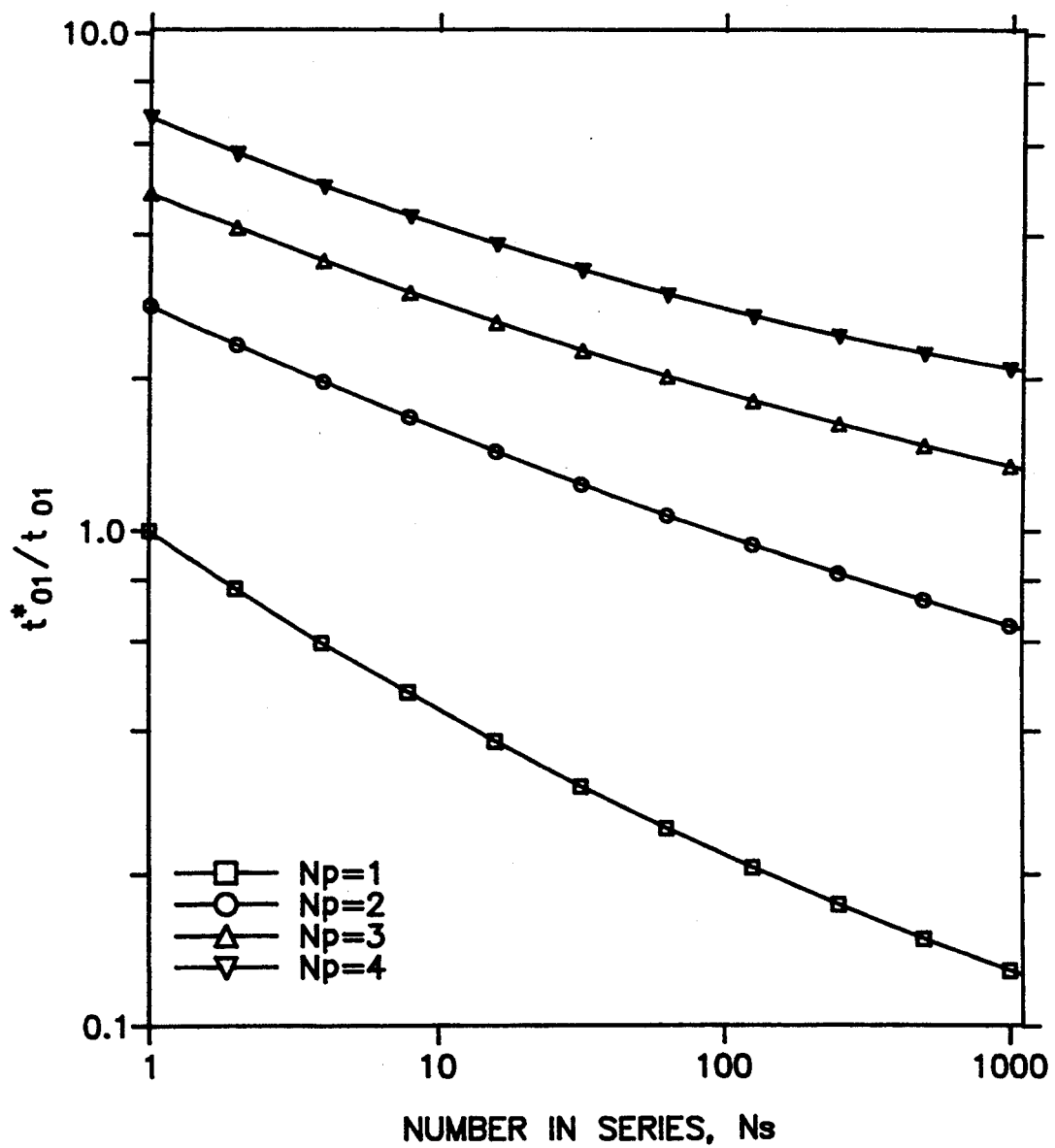
FIG. 12 is a graph showing the relative improvement in the time for 1% of an ensemble of thin metal film interconnects to exhibit electromigration failure when the interconnect is subdivided into various numbers of parallel lines.

Turning now to FIG. 12, there is shown a graph illustrating the enhancement in resistance to electromigration failure that can be obtained by using a number $N_P$ of parallel-connected minimum-width (1.25 μm) lines in place of a wide bus of length L. The failure probability is calculated as:

$$G(t) = 1 - (1 - F(t)^{N_P})^{N_S} \qquad \text{(Equation 7)}$$

where $N_s = L/L_0$. In the graph, $t^*_{01}$ designates the time for 1% of the samples to exhibit electromigration failure.

Figure 13:
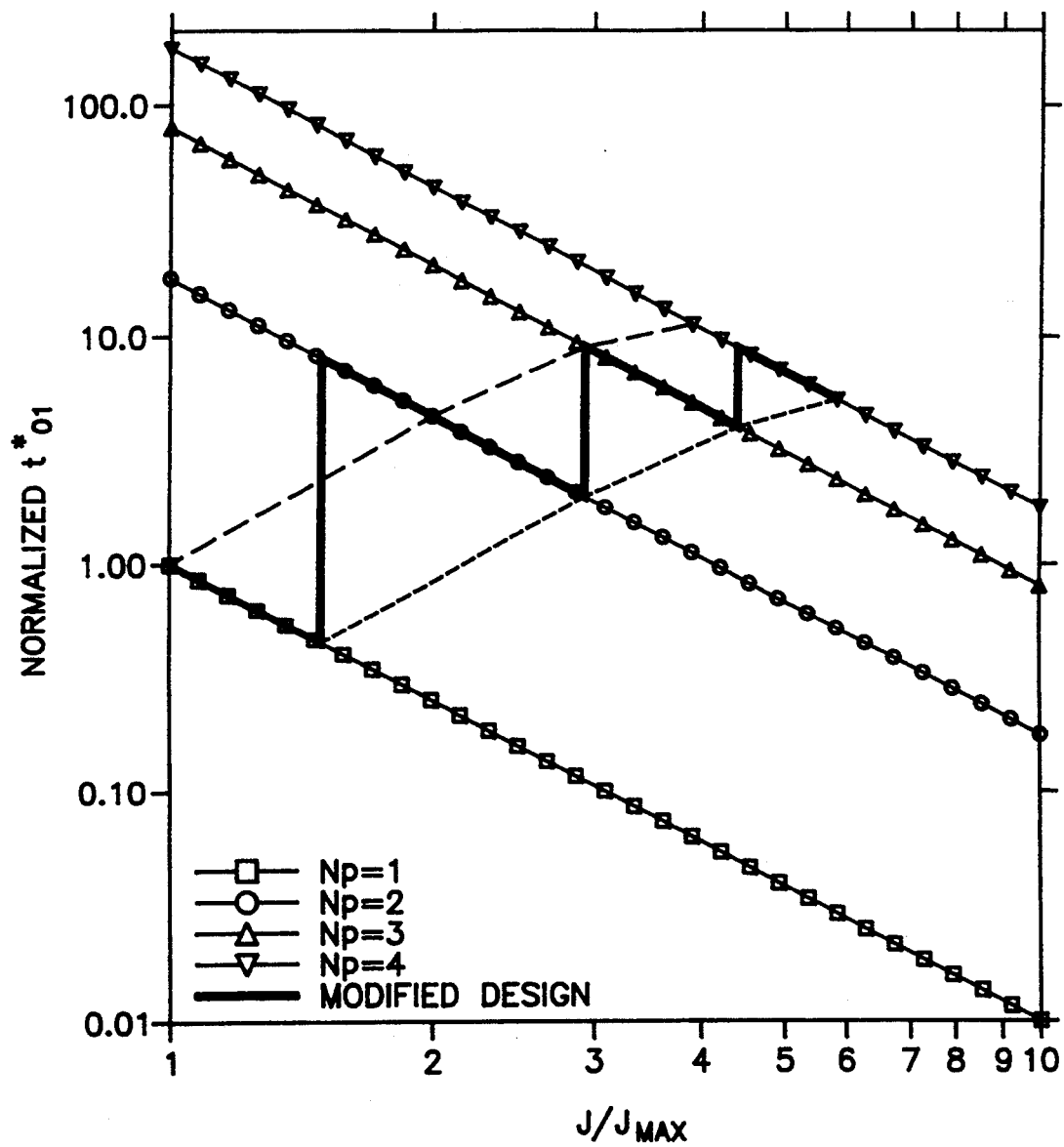
FIG. 13 is a graph showing how the method of the present invention can enhance resistance to electromigration failure and simultaneously permit increased current density in the thin metal film interconnect in order to use chip area more efficiently.

The present invention can also be used to modify a thin metal film interconnect so that it can carry an increased current density and still have enhanced resistance to electromigration failure. As shown in FIG. 13, the data are normalized to $t^*_{01}$ at $N_s = 1$, $N_p = 1$ (i.e., the fundamental lognormal $t_{10}$), and plotted as a function of the increase in current density over the maximum density $J_{max}$ for a conventional design. Within each group of $N_p = 1$, 2, 3, or 4 (representing four alternative designs), the current density is allowed to increase up to 50% over the limit of the previous group before another parallel line is added. It is assumed that the total length of the interconnect is 30 cm ($N_s = 300$) for each design, and each design uses 1.25 μm lines. The 100% and 150% limit points on the four curves are connected by a dashed line and a dotted line, respectively. Vertical lines connecting the curves represent the boundaries between the design current intervals. Because the current density in the lines is increased, chip area can be used more efficiently. As a result, the circuits can be arranged more compactly on the chip, with shorter interconnections, and with improved speed characteristics without compromising reliability.

Figure 14:
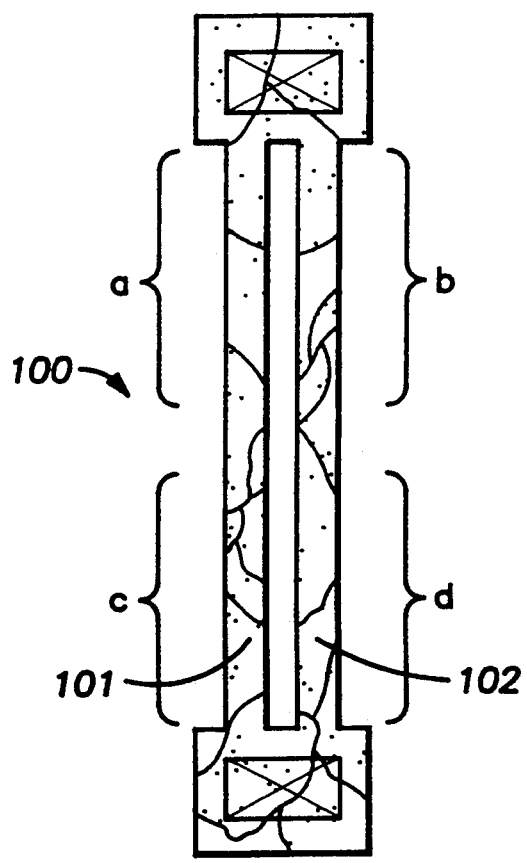
FIG. 14 shows a thin metal film interconnect having a pair of parallel spaced lines.
Figure 15:
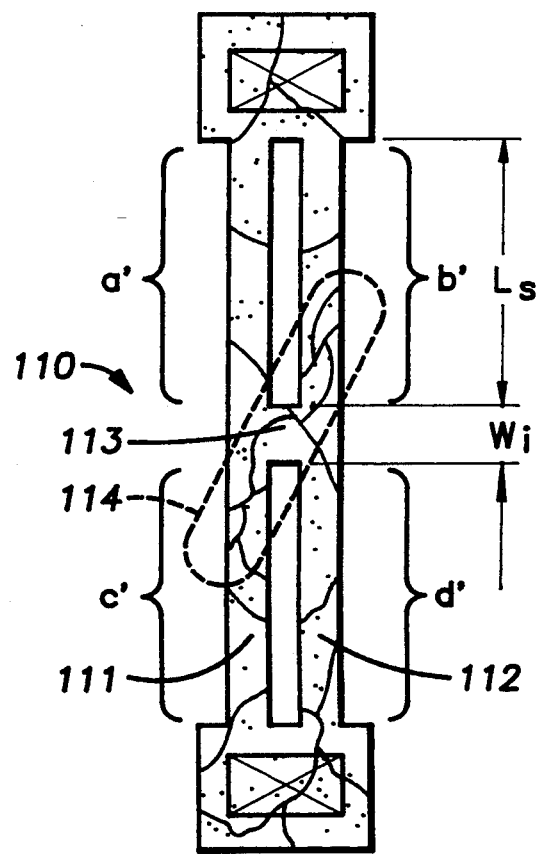
FIG. 15 shows a thin metal film interconnect similar to the interconnect in FIG. 14 but having an intermediate interconnection or bridge between the spaced parallel lines.

Turning now to FIGS. 14 and 15, the question of the optimum value $L_{opt}$ for the slot length $L_S$ in FIG. 11 will be considered with respect to a thin metal film interconnect 100 having two parallel spaced elongated metal film strips 101, 102 without an intermediate interconnection or bridge, as shown in FIG. 14, and a similar interconnect 110 having two parallel spaced elongated metal film strips 111, 112 and an intermediate interconnection or bridge 113, as shown in FIG. 15.

Assuming that electromigration may cause voids to form independently over any of the segments a, b, c, or d in FIG. 14, then the addition of the bridge 113 as shown in FIG. 15 should always enhance the resistance of the interconnection 110 to electromigration failure. However, there is also a cost associated with adding the intermediate interconnect or bridge to the parallel-spaced strips 101 and 102 in FIG. 14, because the bridge may provide a connection between polycrystalline segments. For example, as shown in FIG. 15, a polycrystalline segment 114 circled by a dashed line may begin in segment b', extend across the bridge 113, and continue in segment c'. Without the bridge 113, neither of the portions of the polycrystalline segment in strips 111 and 112 might be sufficiently long or have a sufficient number of triple-points to cause an electromigration failure. But with the bridge 113, the polycrystalline segment 114 might cause one of the segments a', b', c', or d' to fail. The likelihood of such a failure, however, should be minimized by setting the width $W_i$ of the bridge 113 in FIG. 15 to a minimum value.

The slot length $L_S$ should be much longer than the average length of polycrystalline segments, $L_{av}$, to reduce the probability of connecting the segments in parallel lines. On the other hand, as the slots become longer, the reliability enhancement provided by the bridges is reduced. Also, the propagation time constant, RC, of the interconnect is increased, which negatively affects the circuit speed performance. So, the optimum slot length $L_{opt}$ is about ten to twenty times the average length $L_{av}$ of the polycrystalline segments:

$$L_{opt} = (10 \text{ to } 20) L_{av} \quad \text{(Equation 8)}$$

It is assumed that $$L_{av} = AW/D, \quad \text{(Equation 9)}$$

where W is the line width, D is the mean metal grain size, and A is a predetermined constant.

Also, $$L_{av} = ND, \quad \text{(Equation 10)}$$

where N is average number of triple points in a segment. From Equations 8 and 9, $$A = ND^2/W \quad \text{(Equation 11)}$$

From FIG. 3, for $W = 1.25$ μm and $D = 3$ μm, $$N = N_t/N_s = 1.5,$$

where $N_t$ is the total number of triple points in the test line, and $N_s$ is the total number of segments (clusters) in the test line.

From Equation 11, A is 11 μm. From Equation 9, $L_{av}$ is 11 (W/D) μm. Then, Equation 8 gives $$L_{opt} \approx (110 \text{ to } 220) \, W/D \, \mu m \quad \text{(Equation 12)}$$
$$\approx 46 \text{ to } 92 \, \mu m$$

Conclusions

For integrated circuit manufacturing processes having a minimum linewidth less that about one and one-half the grain size of the interconnect metal layer, the resistance of the interconnections to electromigration failure can be substantially improved by using only narrow interconnect lines having a width less than 1.5 times the mean metal grain size. A wide thin metal film interconnect, for example, has a plurality of parallel lines of the minimum linewidth. If the wide interconnect is longer than a predetermined length, then the resistance of the bus to electromigration failure can be further enhanced by strategically placing bridge connections between neighboring ones of parallel lines. The enhanced resistance to electromigration failure can permit the current density in the lines to be increased, so that chip area is used more efficiently. As a result, the circuits can be arranged more compactly on the chip, with shorter interconnections, and with improved speed characteristics without compromising reliability.

While the invention has been described with reference to a specific embodiment, the description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments which fall within the true scope of the invention.

TABLE 1

| Frequency of Lead Failures | | |
|---|---|---|
| Width (μm) | Length (mm) | FLF % |
| 1.25 | 18.9 | 0 |
| 1.25 | 6.3 | 29 |
| 1.25 | 1.05 | 38 |
| 2.0 | 1.05 | 33 |
| 2.75 | 1.05 | 14 |
| 4.25 | 1.05 | 0 |
| 5.75 | 1.05 | 0 |

TABLE 2

| Estimates of IFU parameters | | |
|---|---|---|
| IFU parameters | Linewidth | |
| | 1.25 μm | 4.25 μm |
| σ | 0.975–1.05 | same |
| $t_{50}$ (hr) | 2740–3560 | 400–1200 |
| n (mm$^{-1}$) | 0.48–0.37 | 37.–12.4 |
| $L_0$ (μm) | 2100–2703 | 26–124 |
| N (per 1050 μm) | 0.37–0.50 | 8.5–40 |

TABLE 3

| Estimate of VLSI chip interconnect length near electromigration limit | | | |
|---|---|---|---|
| Width (μm) | Length (mm) | N | $t_{50}$ (hr) |
| 1.5–1.88 | 68 | 62 | 2922 |
| 1.88–2.06 | 509 | 1027 | 2288 |
| 2.06–2.44 | 160 | 616 | 1873 |
| 2.44–2.81 | 78 | 518 | 1582 |
| 2.81–3.19 | 335 | 3598 | 1366 |
| 3.19–3.94 | 188 | 3075 | 1200 |

TABLE 3-continued

Estimate of VLSI chip interconnect length near electromigration limit

| Width (μm) | Length (mm) | N | t₅₀ (hr) |
|---|---|---|---|
| 3.94–9.0 | 655 | 29802 | 876 |

What is claimed is:

1. An integrated circuit comprising:
   (a) a planar substrate, and
   (b) thin metal film deposited on said substrate and connecting a source terminal to a sink terminal for conveying a high density of current from said source terminal to said sink terminal, said thin metal film having metal grains of a mean metal grain size, said thin metal film connecting said source terminal to said sink terminal being subdivided into a plurality of elongated and parallel-spaced neighboring strips extending from said source terminal to said sink terminal, each of said strips having a width of less than one and one-half times said mean metal grain size, whereby said thin metal film has enhanced resistance to electromigration failure when conducting said high density of said electrical current from said source terminal to said sink terminal.

2. The integrated circuit as claimed in claim 1, wherein one of said source and sink terminals is a bonding pad for bonding a lead conductor to said metal film.

3. The integrated circuit as claimed in claim 2, wherein one of said source and sink terminals is a contact region of said metal film connecting said metal film to another layer of said integrated circuit.

4. The integrated circuit as claimed in claim 1, wherein one of said source and sink terminals is a contact region of another layer of said integrated circuit, and each of said elongated strips has a separate respective contact to said contact region.

5. The integrated circuit as claimed in claim 1, wherein said integrated circuit includes numerous elongated metal film conductor lines on said planar semiconductor substrate, said metal film conductor lines having a certain minimum width and minimum spacing, and wherein said elongated and parallel-spaced neighboring strips have said minimum width and minimum spacing.

6. The integrated circuit as claimed in claim 1, wherein said metal film connecting said source terminal to said sink terminal includes intermediate interconnections between neighboring pairs of said elongated strips, said intermediate interconnections being disposed at intermediate locations between said source terminal and said sink terminal.

7. The integrated circuit as claimed in claim 6, wherein said intermediate interconnections define elongated slots between said neighboring pairs of said elongated strips, and most of said elongated slots have lengths that are approximately equal to a predetermined length.

8. The integrated circuit as claimed in claim 7, wherein said predetermined length is about ten to twenty times a mean length of polycrystalline segments in an elongated strip of said width of said metal film.

9. The integrated circuit as claimed in claim 6, wherein said intermediate interconnections have a width ($W_i$), in a direction parallel to said elongated strips, that is a predetermined minimum linewidth of numerous lines of said metal film on said substrate.

10. The integrated circuit as claimed in claim 6, wherein said intermediate interconnections are discontinuous in a direction perpendicular to said elongated strips so that said slots which are on one side of one of said elongated strips are staggered with respect to said slots which are on another side of said one of said elongated strips.

11. An integrated circuit comprising:
    (a) a planar substrate, and
    (b) thin metal film deposited on said substrate and connecting a source terminal to a sink terminal for conveying a high density of current from said source terminal to said sink terminal, said thin metal film having metal grains of a mean metal grain size, said thin metal film connecting said source terminal to said sink terminal being perforated with a plurality of elongated slots aligned along a path from said source terminal to said sink terminal, and neighboring ones of said slots being spaced from each other in a direction perpendicular to said path by elongated strips of said metal film having a width less than one and one half times said mean metal grain size, whereby said thin metal film has enhanced resistance to electromigration failure when conducting said high density of said electrical current from said source terminal to said sink terminal.

12. The integrated circuit as claimed in claim 11, wherein said width is a predetermined minimum linewidth of numerous lines of said metal film on said substrate.

13. The integrated circuit as claimed in claim 12, wherein neighboring ones of said slots are spaced from each other by said width in a direction along said path by bridges of said metal film joining neighboring ones of said elongated strips.

14. The integrated circuit as claimed in claim 11, wherein most of said slots have a predetermined length that is about ten to twenty times a mean length of polycrystalline segments in an elongated strip of said width of said metal film.

15. The integrated circuit as claimed in claim 11, wherein said slots which are on one side of one of said elongated strips are staggered with respect to said slots which are on another side of said one of said elongated strips.

* * * * *